(12) United States Patent
Yotsuya et al.

(10) Patent No.: US 7,268,406 B2
(45) Date of Patent: Sep. 11, 2007

(54) MASK, MASK CHIP, MANUFACTURING METHOD OF MASK, MANUFACTURING METHOD OF MASK CHIP, AND ELECTRONIC DEVICE

(75) Inventors: Shinichi Yotsuya, Chino (JP); Takayuki Kuwahara, Chino (JP); Hiroshi Koeda, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/425,396

(22) Filed: Jun. 21, 2006

(65) Prior Publication Data

US 2007/0017895 A1    Jan. 25, 2007

(30) Foreign Application Priority Data

Jul. 20, 2005   (JP) .............................. 2005-209535

(51) Int. Cl.
    *H01L 31/0232* (2006.01)
(52) U.S. Cl. .......................... 257/435; 438/21; 216/41
(58) Field of Classification Search ................ 257/435, 257/679; 438/21, 26, 689; 216/41, 47, 93
    See application file for complete search history.

(56) References Cited

U.S. PATENT DOCUMENTS 7,045,904 B2 *   5/2006   Odegard et al. ............ 257/787

2003/0129788 A1 *   7/2003   Asano et al. ................ 438/113

FOREIGN PATENT DOCUMENTS

| JP | 10-8239 | 1/1998 |
|----|---------|--------|
| JP | 2001-185350 | 7/2001 |
| JP | 2001-273976 | 10/2001 |
| JP | 2003-67454 | 3/2003 |
| JP | 2003-332056 | 11/2003 |

* cited by examiner

*Primary Examiner*—Phuc T. Deng
(74) *Attorney, Agent, or Firm*—Harness, Dickey & Pierce, P.L.C.

(57) ABSTRACT

A mask in which a plurality of mask chips are connected to one another via a supporting member, includes: a plurality of first opening sections that are provided in the plurality of mask chips and that correspond to a pattern to be formed; a cutout section provided at at least one of side faces opposing to each other of the mask chips adjacent to each other; a gap section provided at a connected section connecting the mask chips adjacent to each other, the gap section being composed of the cutout section and including a second opening section corresponding to a pattern to be formed; and a block section that is provided at at least one of the mask chips adjacent to each other and that covers the gap section other than the second opening section.

9 Claims, 10 Drawing Sheets

| ARRANGEMENT NAME | SCHEMATIC ILLUSTRATION OF PIXEL ARRANGEMENT | TFT WIRING COST | IMAGE | CHARACTER | REMARKS |
|---|---|---|---|---|---|
| LONGITUDINAL STRIPE | | SIMPLE (LOW COST) | ○ | ○ | FREQUENTLY USED IN LCD/PDP<br><br>SIMPLE WIRING<br><br>IMAGE AND CHARACTERS ARE CLEAR |
| DELTA ARRANGEMENT | | COMPLICATED (HIGH COST) | ○ | △ | FREQUENTLY USED IN LARGE-SIZE ORGANIC EL PANELS<br><br>MASK CAN BE EASILY PREPARED |
| SQUARE ARRANGEMENT | | COMPLICATED (SLIGHTLY-HIGH COST) | ○ | ○ | FREQUENTLY USED IN CCD<br><br>INFREQUENTLY USED IN DISPLAY |

FIG. 2

FIG. 5A
THERMAL OXIDATION
(1.8 μm)
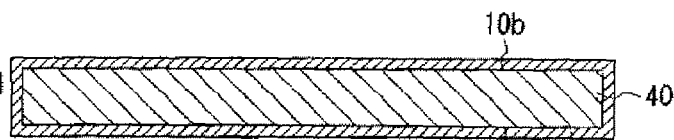
FIG. 5B
1ST PATTERNING AND
ETCHING OF SiO₂
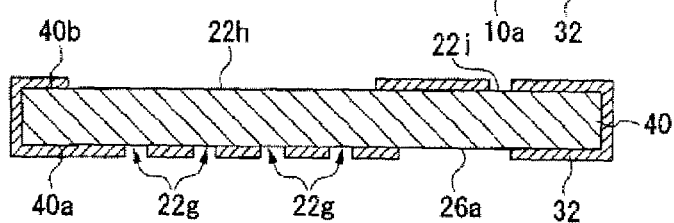
FIG. 5C
2ND PATTERNING
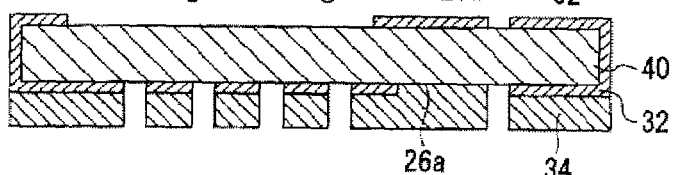
FIG. 5D
ICP DRY ETCHING
(150 μm ETCHING)
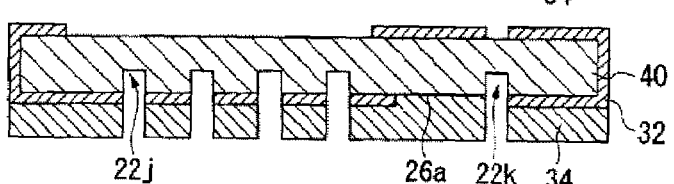
FIG. 5E
RESIST ASHING
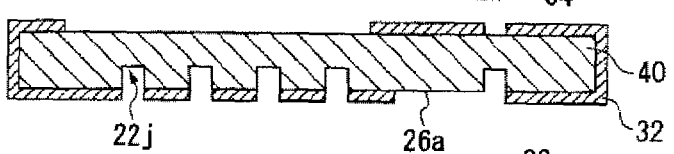
FIG. 5F
DICING
FIG. 5G
WET ETCHING
(35% KOH,
315 μm ETCHING)
FIG. 5H
PEELING OF SiO₂
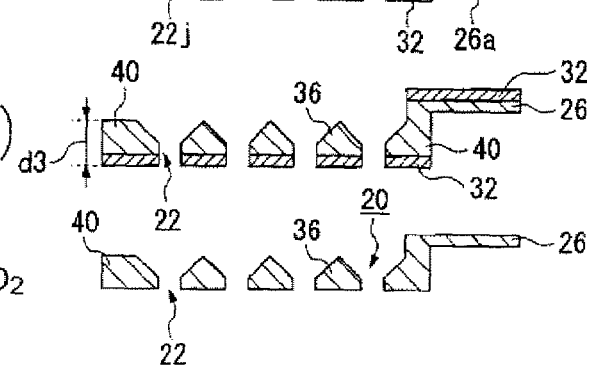

MASK, MASK CHIP, MANUFACTURING METHOD OF MASK, MANUFACTURING METHOD OF MASK CHIP, AND ELECTRONIC DEVICE

BACKGROUND

1. Technical Field

The present invention relates to a mask, a mask chip, a manufacturing method of the mask, a manufacturing method of the mask chip, and an electronic device.

2. Related Art

An organic EL (electroluminescent) panel is composed of highly-responsive light emitting display elements in a layered structure of thin films. Thus, the organic EL panel has a light weight and can be used for a display apparatus providing a superior moving image. Thus, the organic EL panel recently has attracted much attention as a display panel for a flat panel display (FPD) television for example. A representative manufacturing method of the organic EL panel is disclosed in Appl, Phys, Lett, Vol. 51, No.12, p.p. 913-914, (1987). Specifically, the organic EL panel is manufactured in a manner as described below. A photolithographic technique is used to pattern a transparent anode (e.g., ITO (indium tin oxide)) to have a desired shape. Then, an organic material for example is formed and layered on the pattern by a vacuum evaporation apparatus. Next, a metal anode film having a low work function (e.g., MgAg) functioning as a cathode is vapor-deposited on the organic material. Finally, a light-emitting element thus formed is closed and sealed in inert gas atmosphere so that the light-emitting element has a contact with moisture or oxygen.

The organic EL panel also can provide various luminescent colors by changing its light-emitting material. For example, a method has been suggested that uses a thin high definition metal mask to form light-emitting elements of red, green, and blue for each pixel. This method intends to provide a full-color organic EL panel providing a sharp image by a close contact between a metal mask and a glass substrate by a magnet to vapor-deposit the glass substrate and the magnet via the mask (see JP-A-2001-273976 for example).

However, the above metal mask described in JP-A-2001-273976 has a disadvantage as described below. Specifically, when an organic EL panel has an increased size in order to provide a larger screen, a metal mask for the panel also must have an increased size. However, it is very difficult to accurately manufacture such a metal mask that has a large size (large area) and that has a thin thickness. Furthermore, the metal mask has a thermal expansion coefficient that is much higher than that of a glass substrate for an organic EL panel. Due to this reason, the metal mask expands with a rate much higher than that of the glass substrate due to the heat radiation during vapor deposition. This causes, when this metal mask is used to produce a large-size organic EL panel, an increase in a cumulative error value due to the thermal expansion. Thus, the use of the metal mask has been limited to the manufacture of a small to medium size panel having a size of 20 inches at most.

Thus, another method has been suggested that manufactures a vapor deposition mask by using a silicon substrate instead of the metal mask. This method intends to use a silicon substrate itself as a mask using a semiconductor manufacture technique (e.g., photolithographic technique, dry etching technique). Silicon has substantially the same thermal expansion coefficient as that of glass. This prevents the thermal expansion-induced dislocation between a silicon mask and a glass plate as a substrate on which film formation is performed. Silicon also can provide a high machining accuracy (see JP-A-2001-185350 for example). Recently, silicon wafers having a diameter of 300 millimeter have been manufactured. The use of this silicon wafer can produce a vapor deposition panel corresponding to a display panel having a diagonal of about 10.5 inches.

JP-A-2001-273976 is an example of related art.
JP-A-2001-185350 is an example of related art.

By the way, recent televisions generally used for a domestic use mainly have large-size screens ranging from 30 to 40 inches. However, when a silicon-based vapor deposition mask is used to form a light-emitting layer or the like of an organic EL device, the diameter of 300 millimeters of the silicon wafer as described above has caused a limitation on the manufacture of a vapor deposition mask adapted to a large-size screen.

SUMMARY

An advantage of the present invention is to provide a mask and a mask chip that can be used for an accurate patterning of a large-size substrate on which film formation is performed, a manufacturing method of the mask, a manufacturing method of the mask chip, and an electronic device.

According to a first aspect of the present invention, a mask in which a plurality of mask chips are connected to one another via a supporting member includes a plurality of first opening sections that are provided in the plurality of mask chips and that correspond to a pattern to be formed; a cutout section provided at at least one of side faces opposing to each other of the mask chips adjacent to each other; a gap section is provided at a connected section connecting the mask chips adjacent to each other, the gap section is composed of the cutout section and includes a second opening section corresponding to a pattern to be formed; and a block section that is provided at least one of the mask chips adjacent to each other and that covers the gap section other than the second opening section.

According to the present invention, one mask is composed of a plurality of mask chips. Thus, such a mask can be easily provided that can form a thin film pattern larger than a mask chip (including a case where a plurality of thin film patterns are provided in a large area). For example, such a mask can be easily provided that can form a large thin film pattern as a constituting element of a display apparatus having a large-size screen.

By the way, when a plurality of mask chips are connected to a supporting member to form a pattern in a large-size substrate, an inconvenience has been caused where vapor deposition particles penetrate into a connected section having no pattern of mask chips adjacent to each other, causing an increased film thickness of a pixel at a part of the connection of the mask chips. In view of this, the inventor of the present application has conceived of a mask chip including a block section for blocking the connected section of the mask chips. According to the present invention, a clearance section having no pattern in the connected section of the mask chips adjacent to each other is blocked by the block section, thus blocking vapor deposition material by the block section. At the same time, vapor deposition material passes through a gap section at a pattern part in the connected section. This prevents vapor deposition material from penetrating into a part having no pattern of the connected section and thus prevents vapor deposition material from being formed at a part having no pattern. At the same time, other opening sections of the connected section effectively function as an opening section of one pattern. This can securely equalize thicknesses of all pixels, realizing a display apparatus having a further higher definition.

It is preferable that the block section is integrated with the mask chip.

According to this structure, a mask chip can be partially machined to form the block section. Thus, steps can be simplified. Furthermore, the continuous structure of the mask eliminates a junction between a mask chip and a block section. Thus, a mask having high strength can be provided.

It is preferable that, in the mask of the present invention, the plurality of first opening sections of the mask chip are formed to have a rectangular shape when seen from the top and are formed so that sides in the longer direction of the first opening sections are parallel to each other and sides in the shorter direction of the first opening sections are on a single line; an adhesion section to which the supporting member is adhered is provided between the short side of the first opening section of the mask chip and a side of the mask chip opposing to the short side of the first opening section; and the block section of the mask chip is orthogonal to the longer direction of the first opening section and is provided to extend in a direction from one end of the adhesion section of the mask chip to the mask chip adjacent thereto.

According to this structure, a block section of one mask chip extends to a part having no pattern of a connected section a mask chip adjacent to the mask chip. Thus, a clearance section of a part having no pattern at a connected section of mask chips adjacent to each other is covered by the block section. Thus, vapor deposition material is blocked by the block section.

It is preferable that, in the mask of the present invention, a storage section is provided between a short side of the first opening section of the mask chip and a one side of the mask chip opposing to the short side of the first opening section and the storage section stores therein the block section provided at the adhesion section of the mask chip adjacent thereto.

According to this structure, even when a plurality of masks are connected to one another while being adjacent to one another (or being in the vicinity to one another), a block section of one mask chip is stored in a storage section of a mask chip adjacent thereto. This allows mask chips to be connected to each other while being more closely adjacent to each another so as to prevent a block section of the mask chips from being an obstruction to the connection.

It is preferable that, in the mask of the present invention, the mask chip is made of silicon.

According to this structure, the mask chip is made of silicon. Thus, the mask chip has a higher mechanical strength such as tensile strength than that of a metal mask or the like. This can reduce the thickness of a mask and can easily form a mask that has a small extension when being applied with a tensile force.

Also according to this structure, when a substrate on which film formation is performed is a silicon substrate for example, the substrate on which film formation is performed can have the same thermal expansion coefficient as that of a mask. Thus, the present invention can accurately provide a pattern without having an influence by an ambient temperature.

The mask of the present invention includes: a mask chip, comprising: a mask chip body including a plurality of opening sections corresponding to a pattern to be formed in a substrate on which film formation is performed; a cutout section having a shape corresponding to the opening section provided at at least one of opposing side faces of the mask chip body; a block section extending from an end section of one of the side faces of the mask chip body; and a storage section for storing the block section provided at an end section of the other of the side faces of the mask chip body.

According to this structure, a clearance section of a part having no pattern of a connected section of mask chips adjacent to each other is covered by the block section. Thus, vapor deposition material is blocked by the block section. At the same time, vapor deposition material passes through a gap section having a pattern of the connected section. This prevents vapor deposition material from penetrating into a part having no pattern of the connected section, thus preventing vapor deposition material from being formed at a part having no pattern. This securely equalizes film thicknesses of all pixels. Thus, a display apparatus having a further higher definition can be realized.

A manufacturing method of the mask of the present invention includes: forming, in the supporting member, a plurality of opening sections through which vapor deposition material is passed; placing binding material at a position of the supporting member at which the mask chip is placed; placing, at a position at which the binding material of the glass substrate is placed, the adhesion section of the one mask chip; placing the adhesion section of another the mask chip at a position at which the binding material of the glass substrate is placed so that the adhesion section of another the mask chip is adjacent to the placed one mask chip; and sliding the another mask chip in a direction of the one mask chip to store the block section of the another mask chip in the storage section of the one mask chip.

According to this method, a plurality of mask chips can be continuously adhered to a supporting member without causing breakage of the block section of the mask chip. Thus, a large size mask having an integrated structure can be manufactured in a simple and accurate manner and can be used for a patterning of a large size substrate.

A manufacturing method of the mask chip of the present invention includes: forming an insulation film at a surface of a silicon wafer of a plain orientation (110); forming a first pattern in the insulation film at one surface of the silicon wafer at a region forming the pattern and a region corresponding to an outer shape of a mask chip body; forming a second pattern in the insulation film at the other surface of the silicon wafer opposed to a region including the first pattern provided at one surface of the silicon wafer; forming a mask pattern on the first pattern at one surface of the silicon wafer so that the silicon wafer in a region corresponding to an outer shape of the mask chip body is exposed; etching one surface of the silicon wafer by using the mask pattern as a mask to form, in the silicon wafer, a groove pattern penetrating or not penetrating the other surface; removing the mask pattern to subsequently dice the silicon wafer to have an outer shape of the mask chip body; and subjecting one surface and the other surface of the silicon wafer to a crystal anisotropy etching by using the first pattern of the insulation film at one surface of the silicon wafer and the second pattern of the insulation film at the other surface of the silicon wafer as a mask so that the mask chip body includes a plurality of opening sections and a block section extending from the mask chip body.

According to this method, a plurality of opening sections can be formed simultaneously with the formation of a block section extending from a mask chip body. Specifically, the block section can be formed without increasing manufacture steps. Furthermore, the block section and the mask chip body are provided by patterning a silicon wafer of a single material. Thus, the block section can be integrated with the mask chip, thus providing a mask chip having a high strength.

It is preferable that an electronic device of the present invention include an electrooptic apparatus manufactured by the mask.

According to this electronic device, an electrooptic apparatus having a large-size screen can be manufactured for example and a high-definition electronic device free from uneven display can be provided.

In the present invention, the term "electrooptic apparatus" is generally used to include the one having an electrooptic effect according to which a refractive index of substance is changed by an electric field to change the optical transmission and the one for converting electrical energy to optical energy.

BRIEF DESCRIPTION OF THE DRAWINGS

The present invention will be described with reference to the accompanying drawings, wherein like numbers reference like elements.

FIG. 2 illustrates an example of an arrangement of a pixel pattern formed by the mask shown in FIG. 1.

FIGS. 5A to 5H are cross-sectional views illustrating manufacture steps of the mask chip.

DESCRIPTION OF EXEMPLARY EMBODIMENTS

Hereinafter, embodiments of the present invention will be described with reference to the drawings. The respective drawings used in the following description show components appropriately scaled so that the respective components can be recognized. In this embodiment, a coordinate system in FIG. 1 is a right-hand x-y-z orthogonal coordinate system in which a Y-Z plane is parallel to the sheet of FIG. 1 and an X plane is vertical to a Y-Z plane.

(Structure of Mask)

Figure 1:
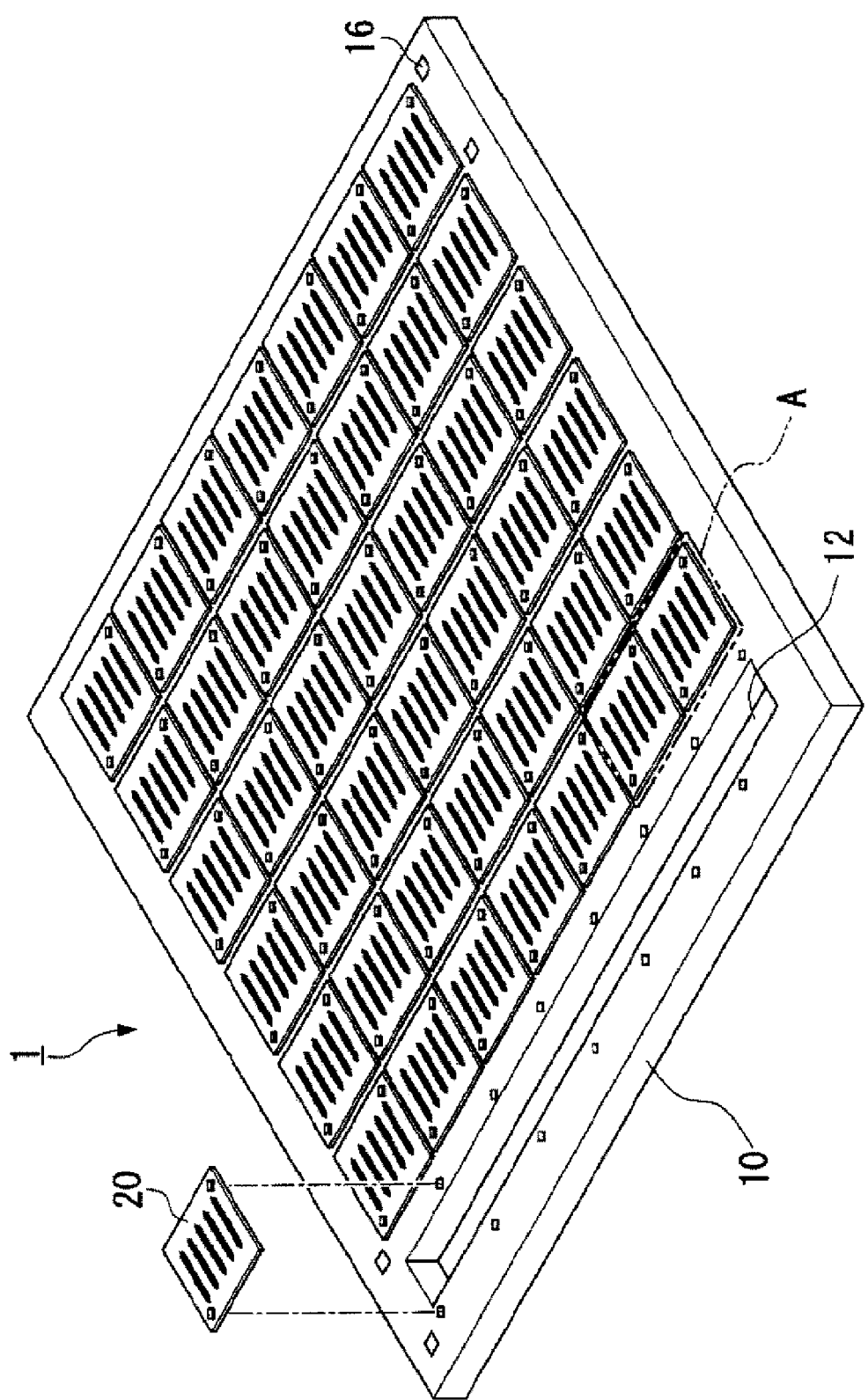
FIG. 1 is a perspective view schematically illustrating a mask.

FIG. 1 is a perspective view schematically illustrating a mask. FIG. 2 illustrates an example of an arrangement of a pixel pattern formed by the mask shown in FIG. 1.

A mask 1 includes: a plurality of mask chips 20; and a glass substrate 10 (supporting member) to which the plurality of mask chips s 20 are adhered.

The mask chip 20 is made of silicon and is formed, as shown in FIG. 1, to include a plurality of long hole-shaped opening sections 22 (first opening sections) arranged to be parallel with one another with a fixed space there among. The opening section 22 of the mask chip 20 has a shape adapted to a thin film pattern having a pixel arrangement of "longitudinal stripe" shown in FIG. 2. Thus, the mask 1 is used to form pixels to form the longitudinal stripe. The mask 1 of this embodiment is the one for forming pixels to form the "longitudinal stripe" shown in FIG. 2. Thus, the opening section 22 of the mask chip 20 has a long thin groove-like shape that has a size corresponding to a region including about 40 corresponding pixels in the longitudinal direction, for example. Specifically, the opening section 22 of the mask chip 20 has a shape that is adapted to at least a part of a thin film pattern formed on a surface on which film formation is performed. A mask chip also may be provided by metal material.

Silicon constituting the mask chip 20 of this embodiment has a plain orientation (110). Alternatively, the mask chip 20 also may be composed of silicon having a plain orientation (100). A side face in the longer direction of the opening section 22 in the mask chip 20 has a plain orientation (111). The plain orientation (111) of the side face of the opening section 22 as described above can be easily realized by subjecting a silicon chip having the plain orientation (110) to a crystal anisotropy etching.

The glass substrate 10 includes a plurality of opening regions 12 arranged to be parallel to one another while having a fixed space thereamong as shown in FIG. 1. Each of the opening regions 12 is an opening section consisting of a rectangular penetration hole. The glass substrate 10 includes mask positioning marks 16. The mask positioning marks 16 are used for the positioning of the mask 1 when the mask 1 is used for vapor deposition. The mask positioning mark 16 can be formed by a metal film for example. The glass substrate 10 includes the opening regions 12 so that the opening regions 12 are arranged to be parallel with one another with a fixed space thereamong as shown in FIG. 1. Each of the opening regions 12 is an opening section consisting of a rectangular penetration hole.

The glass substrate 10 is preferably made of such material that has the same or similar thermal expansion coefficient as a thermal expansion coefficient of material constituting the mask chip 20. Since the mask chip 20 is made of silicon, the glass substrate 10 is made of such material that has the same or similar thermal expansion coefficient as that of silicon. This can suppress the glass substrate 10 and the mask chip 20 from having "distortion" or "deflection" due to a difference in the thermal expansion. For example, silicon has a thermal expansion coefficient of $30 \times 10^{-7}$/degrees C. that is substantially the same as a thermal expansion coefficient of $30 \times 10^{-7}$/degrees C. of Pyrex® glass made by Corning Incorporated. Other materials having a thermal expansion coefficient close to that of silicon include, for example, non-alkali glass OA-10 made by Nippon Electric Glass Co., Ltd. having a thermal expansion coefficient of $38 \times 10^{-7}$/degrees C. and metal materials such as 42 alloy having a thermal expansion coefficient of $50 \times 10^{-7}$/degrees C. and inver having a thermal expansion coefficient of $12 \times 10^{-7}$/degrees C. Thus, the glass substrate 10 can be made of Pyrex® glass, non-alkali glass OA-10, or 42 alloy for example.

The respective mask chips 20 are arranged to form a matrix on the glass substrate 10 so that the mask chips 20 block the opening regions 12 of the glass substrate 10 and so that the longer direction of the opening region 12 is orthogonal to the longer direction of the opening sections 22 of the mask chips 20. The opening section 22 has a width that is the same as a subpixel pitch d1 of a pixel for example. Mask chips 20A and 20B, which are the mask chips 20 adjacent to each other to block a single opening region 12, are arranged with a space therebetween by a subpixel pitch of a pixel. A space between the mask chips 20A and 20B has the same function as that of the opening section 22 of the mask chip 20 and functions as an opening section of the mask 1 for forming a thin film pattern having a desired shape. The mask chips 20 adjacent to each other are also arranged to have a space therebetween in a direction orthogonal to the longer direction of the opening region 12. The respective plurality of mask chips 20 are arranged on the glass substrate 10, as shown in FIG. 1, to form a matrix while having a space thereamong.

As described above, the mask 1 of this embodiment is provided so that the plurality of mask chips 20 are attached to the glass substrate 10. Thus, a thin film pattern larger than the mask chip 20 can be formed. For example, pixels for a longitudinal stripe pattern constituting a display panel for a large-size screen can be formed.

(Structure of Mask Chip)

Next, the mask chip of this embodiment will be described with reference to the structure.

Figure 3:
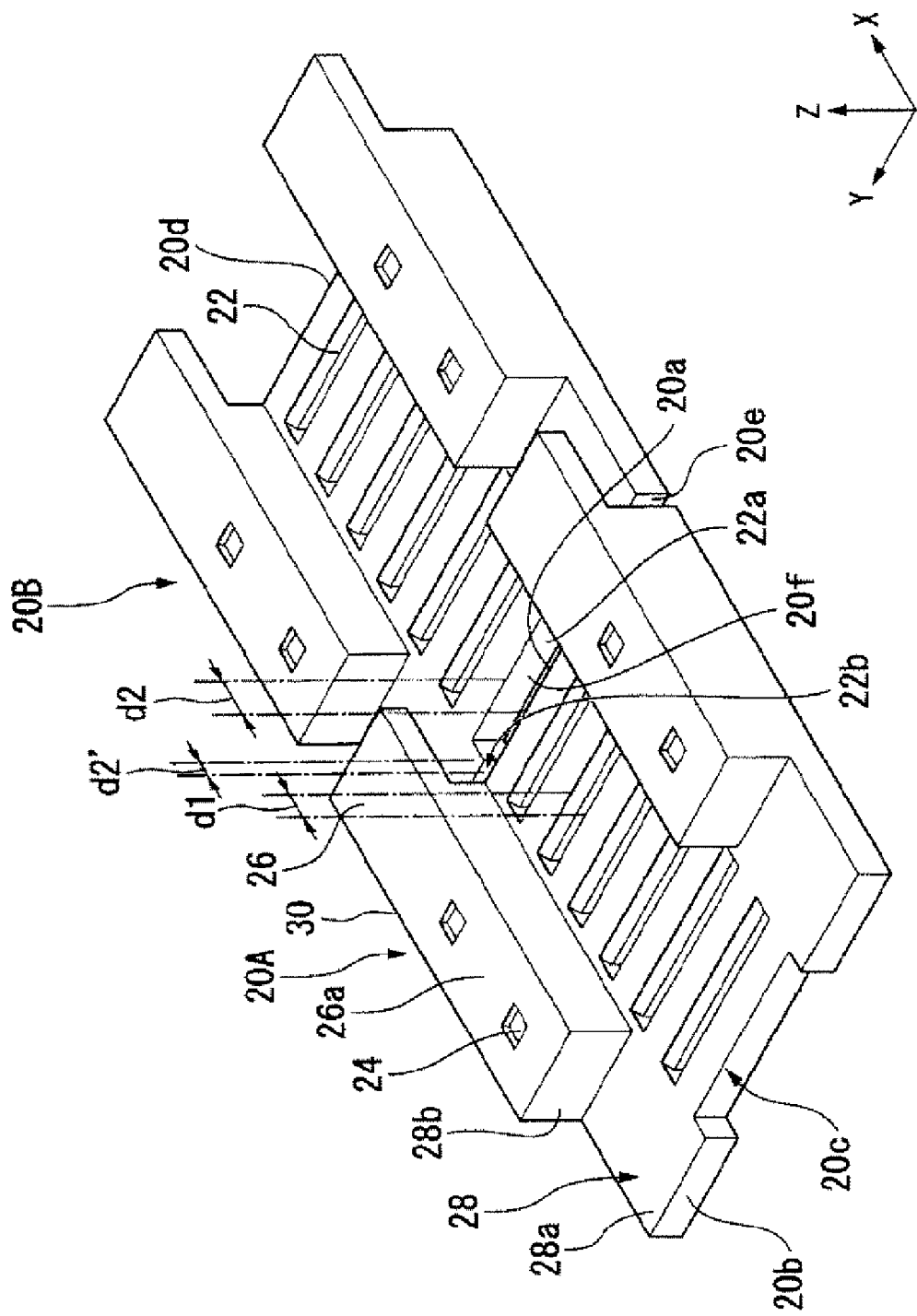
FIG. 3 is an expanded view of the mask chip shown in FIG. 1.
Figures 4A, 4B:
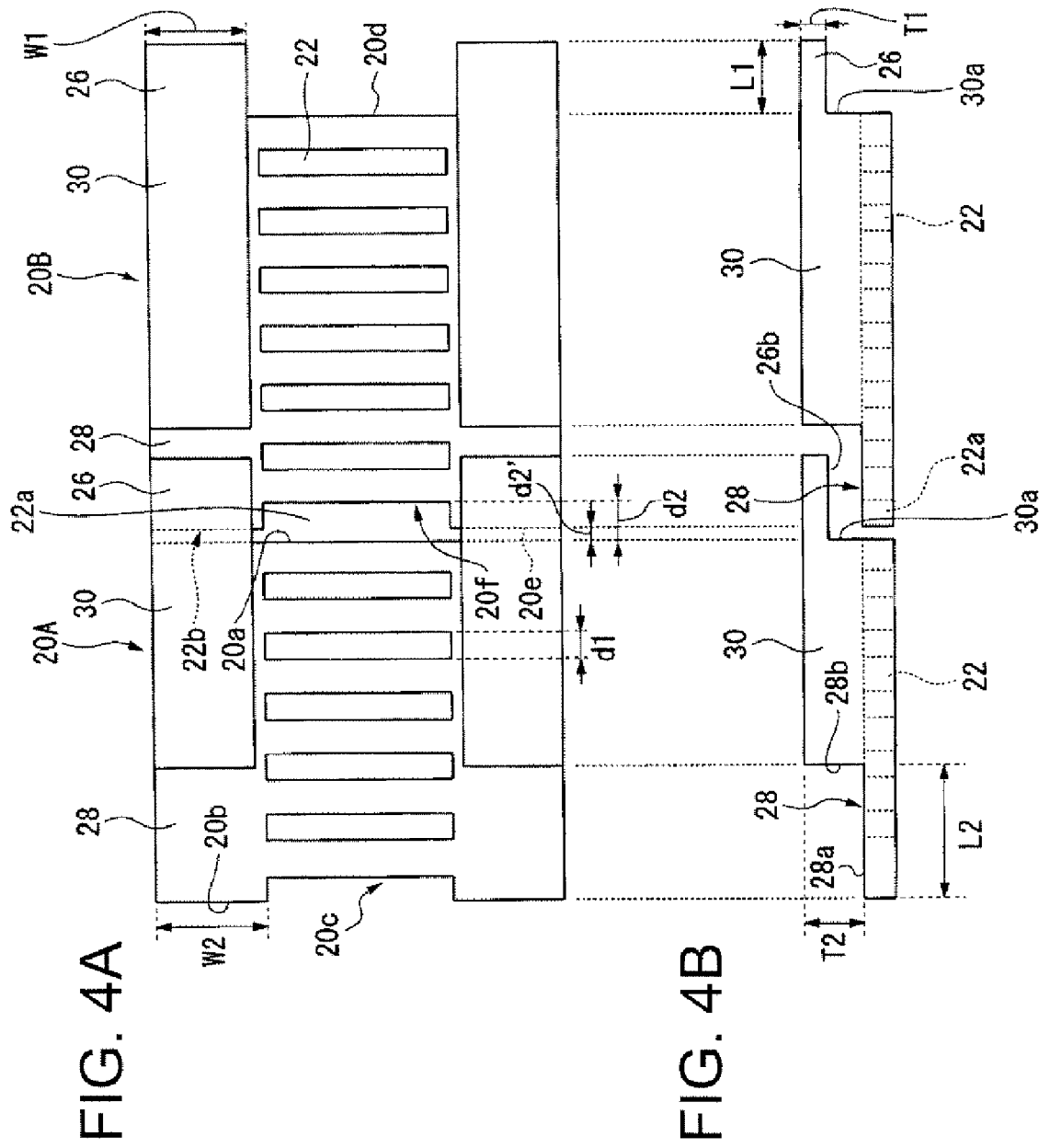
FIG. 4A is a top view of a mask chip.
FIG. 4B is a cross-sectional view of the mask chip shown in FIG. 4A.

FIG. 3 is an expanded perspective view schematically illustrating the mask chip of the mask shown in FIG. 1 (region "A" in FIG. 1). FIG. 4A is a top view schematically illustrating the structure of the mask chip. FIG. 4B is a cross-sectional view of the mask chip shown in FIG. 4A. It is noted that FIG. 3 and FIGS. 4A and 4B will illustrate only the mask chip 20A and the mask chip 20B adjacent to each other and will not illustrate the glass substrate 10 as a supporting member. The following description will assume that plane sides of the mask chips shown in FIG. 3 and FIG. 4 are a plane to which vapor deposition is performed.

The mask chips 20A and 20B are formed, as shown in FIG. 3, to have a rectangular shape when seen from the top and to have a predetermined thickness. The respective mask chips 20A and 20B include a plurality of opening sections 22 formed so as to penetrate the mask chips in the thickness direction. The opening sections 22 correspond to a pattern of a light-emitting layer or the like formed in an organic EL substrate (which will be described later). The plurality of opening sections of the mask chips 20A and 20B are formed to have a rectangular shape when seen from the top and are arranged so that opening sections 22 have lengths in the longer direction parallel to one another and the shorter directions of the opening sections 22 are on a single line.

As shown in FIG. 3 and FIG. 4A, a side face 20a of the mask chip 20A to the mask chip 20B is made flat and an opposite side face 20b includes a cutout section 22c having a shape obtained by removing one long side of the above-described opening section 22. Similarly, a side face 20e of the mask chip 20B to the mask chip 20A includes a cutout section 22f having a shape obtained by removing one long side of the above-described opening section 22. An opposite side face 22d is made flat. Specifically, when the mask chip 20A is connected to the mask chip 20B, the connected section therebetween includes an opening section 22a (the second opening section) having a width d as shown in FIG. 3. The opening section 22a is composed of a flat surface of the side face 20a of the mask chip 20A and the cutout section 22f of the side face 20e of the mask chip 20B and has the same function as that of the opening section 22. This opening sections 22a have, as shown in FIG. 3 and FIG. 4A, substantially the same shape and area as those of the opening section 22 and are arranged so as to have the same interval as those of other opening sections 22. In this embodiment, the mask chips 20A and 20B are adhered to the glass substrate 10 so that a slight gap section d2' remains between the mask chips 20A and 20B. A clearance section 22b of this width d2' is an opening section not required for the formation of a pattern.

Between the short side of the opening section 22 of the vapor deposition face side of the mask chips 20A and 20B and the opposing mask chip 20 (upper and lower regions including no opening section in FIG. 3), an adhesion section 30 is provided for adhering the mask chips 20A and 20B to the glass substrate 10. The adhesion section 30 is a step section protruding from a plane including the opening sections. The adhesion section 30 has an upper face 30b that includes alignment marks 24 used for the positioning with the glass substrate 10. The alignment mark 24 is provided by, for example, patterning chromium or the like to have a rectangular shape when seen from the top.

One end section at the mask chip 20B side of the adhesion section 30 (right sides in FIG. 3 and FIG. 4A) includes a block section 26 that extends in a direction from the side face 30a of the adhesion section 30 to the mask chip 20B (direction substantially vertical to the longer direction of the opening section 22). The block section 26 has an upper face 26a that extends in a face extending from the upper face 30a of the adhesion section 30. The block section 26 has the same width as that of the length of the adhesion section 30 in the shorter direction. The block section 26 has a lower section 26b that is cut out by an etching or the like as shown in FIG. 4B and that is formed to have a roof-like shape to the gap section 22b. This block section 26 having a roof-like shape has a thickness T1 that prevents the block section 26 from having a contact with a plane 28a of a storage section 28 (which will be described later). The block section 26 has a straight length L1 in the extending direction that is a length that prevents the block section 26 from having a contact with the side face 28b of the storage section 28 (which will be described later). In this embodiment, the block section 26 and the adhesion section 30 are machined out of a single material and have an integrated structure. Thus, the block section 26 of the mask chip 20A can cover the gap section 22b having no pattern formed at the connected section of the mask chips 20A and 20B. The above-described block section 26 is also formed at the mask chip 20A.

At the other side of the adhesion section 30 of the mask chip 20B (left side in FIG. 3 and FIG. 4A), the storage section 28 for storing the block section 26 of the mask chip 20A is provided. The storage section 28 is provided by cutting out the other end section of the adhesion section 30 by an etching or the like. The storage section 28 has a plane 28a that is in the same plane as that of a region including the opening sections. The storage section 28 has a length L2 of the plane 28a, a thickness T2 of the side face, and a width W2 or the like that are formed to correspond to the thickness T1, the straight length L1, and the width W1 of the block section 26 as described above. The storage section 28 as described above is also provided at the mask chip 20B.

As described above, this embodiment provides a pair of the block section 26 and the storage section 28 for every mask chip 20 shown in FIG. 1. This structure allows, when the mask chip 20A and the mask chip 20B adjacent to each other are connected to each other, the block section 26 of the mask chip 20A to be stored in the storage section 28 of the mask chip 20B, thus providing a continuous arrangement of the mask chips 20.

According to this embodiment, the clearance section 22b having no pattern at the connected section of the mask chips 20A and 20B adjacent to each other is covered by the block section 26. Thus, vapor deposition material is blocked by the block section 26. This prevents the vapor deposition material from penetrating into the connected section having no pattern, thus preventing the vapor deposition material from being formed at a position having no pattern. This can securely equalize the thicknesses of all pixels, thus realizing a display apparatus having a further higher definition.

Also according to this embodiment, the mask chip 20 can be partially machined to provide the block section 26, thus simplifying the process. Furthermore, the continuous arrangement of the mask chips 20 eliminates a junction between the mask chip 20 and the block section 26. Thus, the mask 1 having a high strength can be provided.

Also according to this embodiment, even when a plurality of masks 1 are connected to one another while being adjacent to one another (or being in the vicinity to one another), the block section 26 of the mask chip 20A is stored in the storage sections 28 of the neighboring mask chip 20B. This allows the mask chips 20A and 20B to be connected to each other while being more closely adjacent to each another so as to prevent the block section 26 of the mask chip 20A from being an obstruction to the connection.

(Manufacturing method of Mask Chip)

FIGS. 5A to 5H are cross-sectional views illustrating manufacture steps of a mask chip. Manufacture steps of the glass substrate 10 as a supporting member will be described later.

First, a 4-inch silicon wafer 40 having a plain orientation (110) is prepared. The silicon wafer 40 has a thickness of 400 μm and both surfaces thereof are subjected to mirror polishing. Next, as shown in FIG. 5A, the thermal oxidation method is used to form an oxide silicon film 32 ($SiO_2$) as an etching resist mask member on the silicon wafer 40. In particular, the silicon wafer 40 is left in atmosphere of oxygen of 1000 to 1100 degrees C. and moisture vapor to bind silicon with oxygen. As a result, the oxide silicon film 32 having a thickness of 1.8 μm for example is formed at the surface of the silicon wafer 40. It is noted that a film formed at the entire surface of the silicon wafer 40 may be a film that is resistant in a crystal anisotropy etching of the silicon wafer 40 using strong alkali aqueous solution (which will be described later). Thus, a silicon nitride film (Si3N4) and a silicon carbide film (SiC) by the CVD method as well as an Au or Pt film by the sputter method for example also may be formed as an etching resist mask member at the entire surface of the silicon wafer 40.

Next, a resist is coated on one surface 40a of the silicon wafer 40 and a photolithography processing is used to pattern the resist so that silicon at a region 22g corresponding to the pattern and a region 26a constituting the block section 26 (region corresponding to the outer shape of the mask chip body) is exposed. Then, the resist is used as a mask for an etching of the oxide silicon film 32 of the one surface 40a of the silicon wafer 40. As a result, a groove pattern (the first pattern) consisting of a plurality of grooves as shown in FIG. 5B is obtained. In this groove pattern, silicon is exposed at the region 22g constituting the pattern and the region 26a constituting the block section. Here, the groove pattern is formed so that silicon orientation (111) is orthogonal to the longer direction of the groove pattern. The groove pattern also may be formed simultaneous with the formation of alignment marks on the silicon wafer 40.

The above method is also used to etch, as shown in FIG. 5B, the oxide silicon film 32 at a region 22h of the other surface 40b of the silicon wafer 40 opposed to the region corresponding to the groove pattern of the one surface 40a of the silicon wafer 40. As a result, a groove pattern (second pattern) is formed in which the silicon wafer 40 is exposed at the other surface 40b of the silicon wafer 40. At the same time, the oxide silicon film 32 at a region 22i corresponding to an outer periphery of the mask chip 20 is also etched. The reason why the opening sections are provided at the oxide silicon film 32 of the other surface 40b of the silicon wafer 40 as described above is that this allows a subsequent step to reduce the thickness of the silicon wafer 40. This can reduce the thickness of the mask chip 20 so that vapor deposition particles during vapor deposition can easily pass through the opening section 22 in an oblique direction, thus equalizing the thicknesses of formed thin films.

Next, resist is coated on the one surface 40a of the silicon wafer 40. Then, resist is patterned, as shown in FIG. 5C, so that resist 34 is left on the oxide silicon film 32 and on a block section-forming region 26a on which silicon is exposed. This step intentionally provides the groove sections in the silicon wafer in order to prevent, during the subsequent crystal anisotropy etching, a crystal face (111) inclined to the wafer surface with 35 degrees C. from appearing at both sides of a groove section to deform the etching shape.

Next, the above patterned resist 34 of the one surface 40a of the silicon wafer 40 is used as a mask to perform a dry etching processing by DEEP-RIE as shown in FIG. 5D. As a result, the silicon wafer 40 not covered by resist is etched to form groove patterns 22j not penetrating the silicon wafer 40. The oxide silicon film 32 of the region 22k corresponding to the outer periphery of the mask chip 20 is also etched. It is noted these grooves also may penetrate the silicon wafer. Dry etching also may be performed by ICP (Inductively Coupled Plasma).

After the formation of the groove patterns 22j in the silicon wafer 40, the resist formed on the oxide silicon film 32 and the block section-forming region 26a is removed by ashing as shown in FIG. 5E. As a result, the block section-forming region 26a of the one surface 40a of the silicon wafer 40 is exposed.

Next, the silicon wafer 40 is diced (or separated) as shown in FIG. 5F to have an outside dimension of the silicon chip shown in FIG. 3. The reason why the dicing is performed before a wet etching step (which will be described later) is that a part of a mask chip has a reduced thickness by the wet etching and thus the handling is deteriorated due to the warpage of a wafer for example. Another reason is to complete the dicing before such damage is caused that is due to a crack or the like of the silicon wafer 40 having a reduced thickness.

Next, both surfaces of the silicon wafer 40 are subjected, as shown in FIG. 5G, to a crystal anisotropy wet etching processing. Specifically, the silicon wafer 40 is immersed, for a predetermined time, in 35 Wt % potassium hydroxide aqueous solution heated to 80 degrees C. for example. As a result, the one surface 40a and the other surface 40B of the silicon wafer 40 not covered by the oxide silicon film 32 are subjected to an anisotropic etching due to the dependency on crystal orientation. This etching reduces the thickness of the silicon wafer 40 to a thickness d3, providing the opening section 22 penetrating the silicon wafer 40. This etching also etches a corner section 36 of the opening section 22 of the other surface 40b of the silicon wafer 40 to have a tapered shape. This etching also etches, as shown in FIG. 5G, the block section-forming region 26a of the silicon wafer 40, thus forming the block section 26 having a roof-like shape extending from the end section of the silicon wafer 40. It is noted that the etching time of the crystal anisotropy etching can be controlled to control the tapered shape of the corner section 36 and the thickness d3 of a region including the opening section 22. Thus, a favorable mask can be manufactured in which a shadow region of the mask 1 does not change even when the relative positional relation between the mask 1 and a vapor deposition target is changed.

Finally, the silicon wafer 40 is immersed in hydrofluoric acid-base etching solution as shown in FIG. 5H to remove the oxide silicon film 32 formed at the surface of the silicon wafer 40. In this manner, the mask chip 20 having the block section 26 can be obtained.

According to this embodiment, a plurality of opening sections 22 can be formed simultaneously with the formation of the block section 26 extending from the mask chip 20. Specifically, the block section 26 can be formed without increasing manufacture steps. Furthermore, the block section 26 is provided by patterning a silicon wafer of the same material as that of the mask chip body and thus can be integrated with the mask chip 20. Therefore, the mask chip 20 having a high strength can be provided.

Furthermore, this manufacturing method subjects the silicon wafer 40 having the plain orientation (110) to a crystal anisotropy etching so that the longer direction of the opening section 22 is orthogonal to the orientation (111). Thus, the side face in the longer direction of the opening section 22 is in the orientation (111). Thus, the crystal anisotropy etching as described above can set an etching ratio between the depth of the opening section 22 and the side face in the longer direction of the opening section 22 to be 1:100 for example to accurately control the width of the opening section 22.

(Manufacturing method of Glass Substrate)

Next, a machining method of a glass substrate used as a supporting member of a mask chip will be described.

Figure 6A:
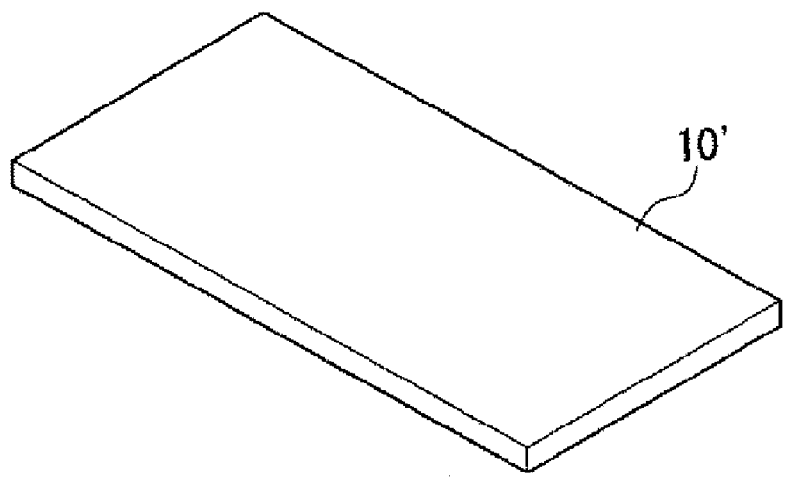
FIGS. 6A to 6C are perspective views illustrating manufacture steps of a glass substrate as a supporting member.
Figure 6B:
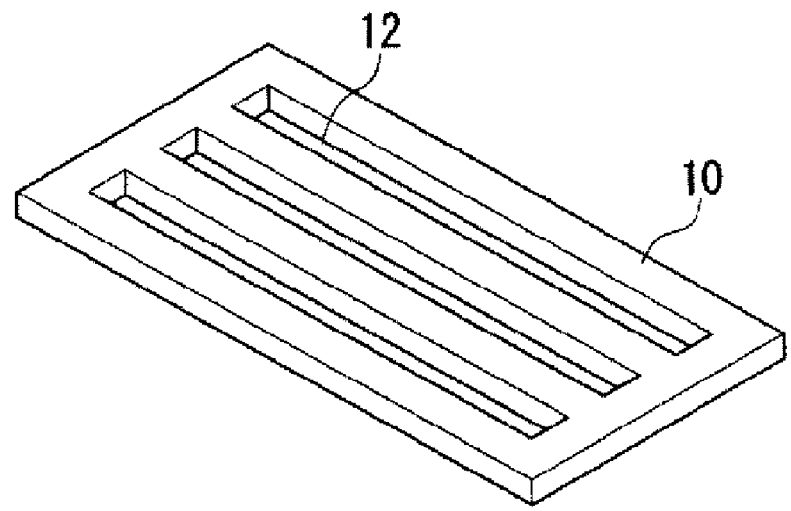
Figure 6C:
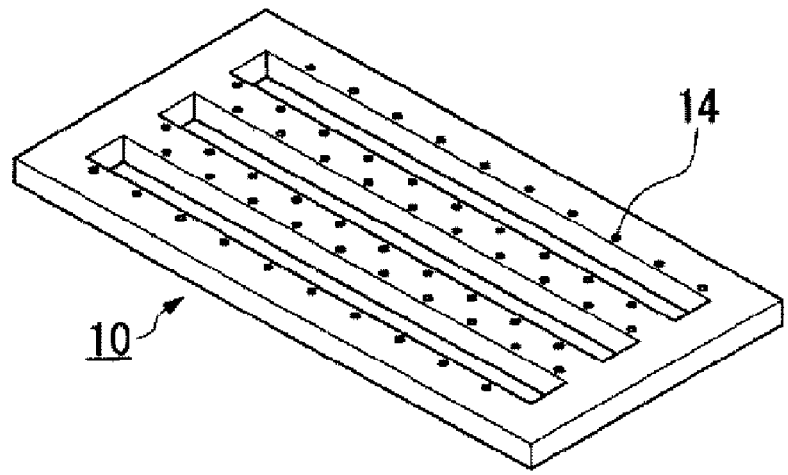

FIGS. 6A to 6C are perspective views illustrating machining steps of the glass substrate 10.

First, as shown in FIG. 6A, Pyrex® glass added with sodium or a non-alkali glass 10' (e.g., OA-10) is prepared. Then, this glass is cut to have an outer shape of a vapor deposition mask.

Next, as shown in FIG. 6B, in the glass substrate 10 cut out to have a predetermined shape, a penetration hole through which vapor deposition material is passed is formed. This penetration hole has a rectangular shape when seen from the top. This penetration hole is formed by a method for polishing, by the blast method, the glass substrate 10 made of Pyrex® glass or non-alkali glass such as OA-10. Other method for forming a penetration hole in the glass substrate 10 include a method combining the photolithography technique with a wet etching by hydrofluoric acid. When the glass substrate 10 is made of metal material such as 42 alloy, the opening region 12 also may be formed by the photolithographic technique and the wet etching, may be manufactured by assembling a plurality of metal materials by welding the materials, or may be manufactured by a cutting processing or a casting.

Next, the alignment marks 14 are formed in the glass substrate 10 as shown in FIG. 6C so that the respective mask chips can be adhered to the glass substrate 10 in a regular and accurate manner. The alignment marks 14 are formed by the following method for example. First, a Cr film is formed on the glass substrate 10 by the sputter method. Next, resist is coated on the Cr film by the spin coat method and the coated Cr film is subjected to exposure and development processings. Then, resist patterned to have a predetermined shape is used as a mask and the Cr film is subjected to a wet etching with the mask, thereby providing the alignment marks 14. The alignment marks 14 also may be markings by laser or the like. The steps as described above provide the glass substrate 10 to which mask chips are adhered.

(Mask Manufacturing Method)

Next, the following section will describe a method for adhering the plurality of mask chips s manufactured by the above method to a glass substrate.

Figure 7A:
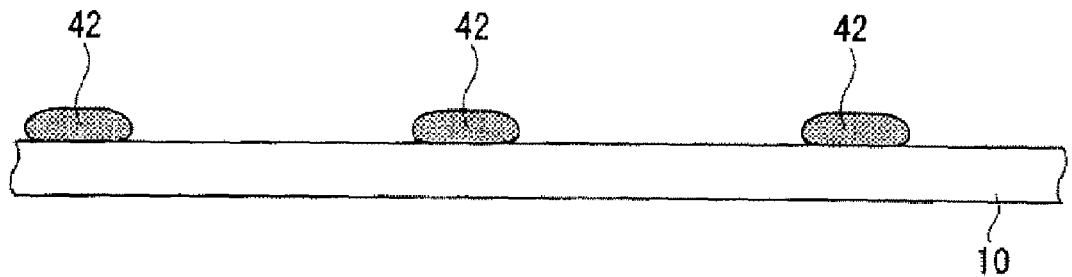
FIGS. 7A to 7C are cross-sectional views illustrating steps for adhering the mask chip to the glass substrate.
Figure 7B:
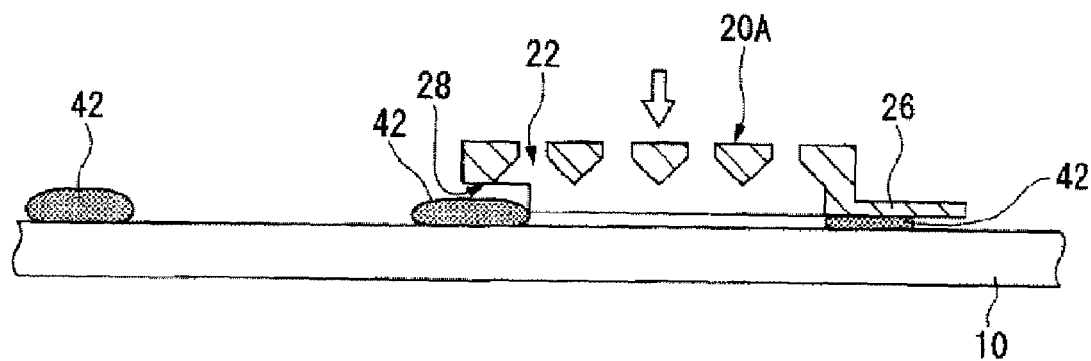
Figure 7C:
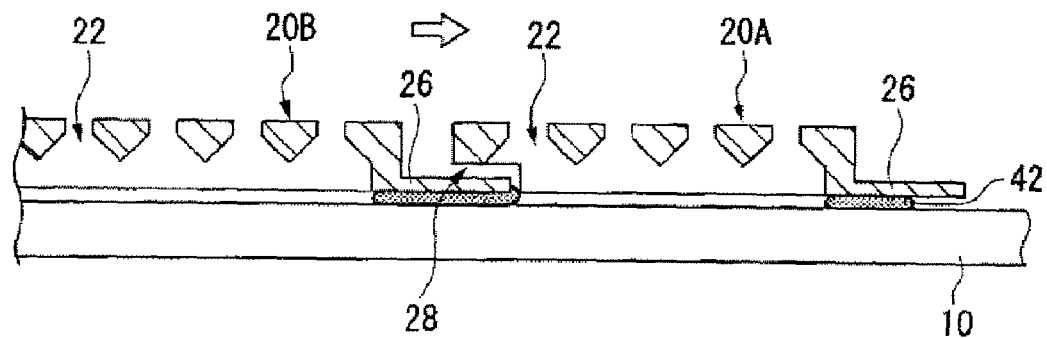

First, FIGS. 7A to 7C are cross-sectional views illustrating steps for adhering a plurality of mask chips to the glass substrate 10.

As shown in FIG. 7A, binding materials 42 are firstly positioned by a dispenser or the like to positions of the glass substrate 10 corresponding to the adhesion sections 30 of the mask chips 20. The binding material 42 may be, for example, ultraviolet cure polyimide resin or acrylic resin.

Next, the mask chip 20A is adhered, as shown in FIG. 7B, to the end section at the right side of FIG. 1 for example. During this adhesion, the alignment between the alignment marks of the mask chip 20A and the alignment marks 14 of the glass substrate 10 is adjusted and the mask chips 20A are positioned on the binding material 42 of the glass substrate 10.

Next, as shown in FIG. 7C, the mask chip 20B is aligned with a position adjacent to the mask chip 20A on the glass substrate 10. Then, the binding material 42 on the glass substrate 10 is abutted with the adhesion section 30 of the mask chip 20B in order to prevent the block section 26 of the mask chip 20B from having a contact with the mask chip 20A. Next, as shown in FIG. 7C, the mask chip 20B is slid in the direction of the mask chip 20A and the storage section 28 of the mask chip 20A is stored in the block section 26 of the mask chip 20B. By repeating the operations as described above, a plurality of mask chips 20 are adhered to the glass substrate 10. Finally, after all mask chips are adhered to the glass substrate 10, ultraviolet rays are emitted to the glass substrate 10 to cure the binding material 42, thereby fixing the mask chips to the glass substrate 10. In this manner, a plurality of mask chips 20 are adhered to the glass substrate 10, thereby manufacturing the mask.

According to this embodiment, a plurality of mask chips 20 can be continuously adhered to the glass substrate 10 without causing breakage of the block section 26 extending from the mask chip 20. Thus, the mask 1 having an integrated structure and a large size can be manufactured in an easy and accurate manner, thus forming a pattern in a large size substrate.

In addition to the above method, another method as described below also may be used. In FIG. 7, the mask chip 20B is firstly placed on the glass substrate 10 and then the mask chip 20A is placed to be adjacent to the mask chip 20B. Then, the mask chip 20A is adhered to the glass substrate 10 via the binding material 42 by lowering the mask chip 20A so that the storage section 28 of the mask chip 20A stores therein the block section 26 of the mask chip 20B. By repeating the operations as described above, a plurality of mask chips 20 are adhered to the glass substrate 10, thereby manufacturing the mask 1.

This method provides the same effect as that of the above-described method. At the same time, this method allows, without sliding the mask chip 20, the block section 26 of the mask chip 20A to be directly set in the storage section 28 of the mask chip 20B. Thus, the manufacture steps can be simplified.

(Manufacturing Method of Electrooptic Apparatus)

Next, the following section will describe a manufacturing method of an active matrix-type organic EL device as an example of an electrooptic apparatus according to an embodiment. The following description will explain a method for forming a light-emitting material (light-emitting layer) on a transparent substrate (substrate to be subjected to vapor deposition) constituting an organic EL device by the above-described mask 1 and will not explain other manufacturing methods of an organic EL device.

Figure 8A:
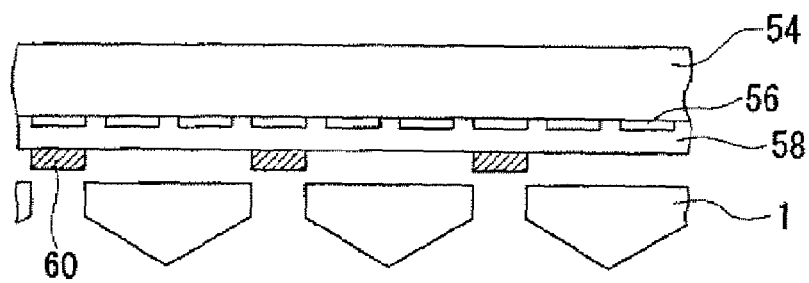
FIGS. 8A to 8C are cross-sectional views illustrating manufacture steps of an organic EL device using the mask of the present invention.
Figure 8B:
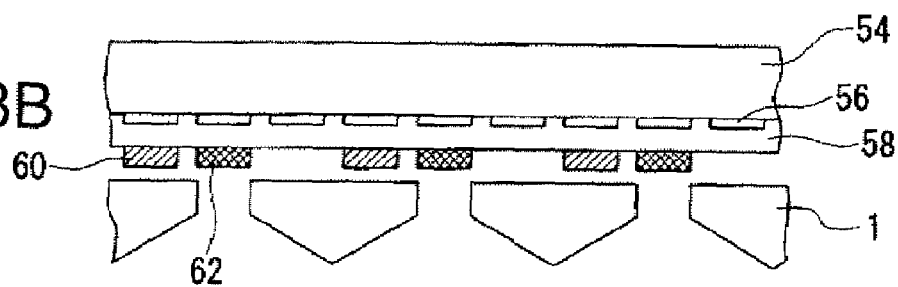
Figure 8C:
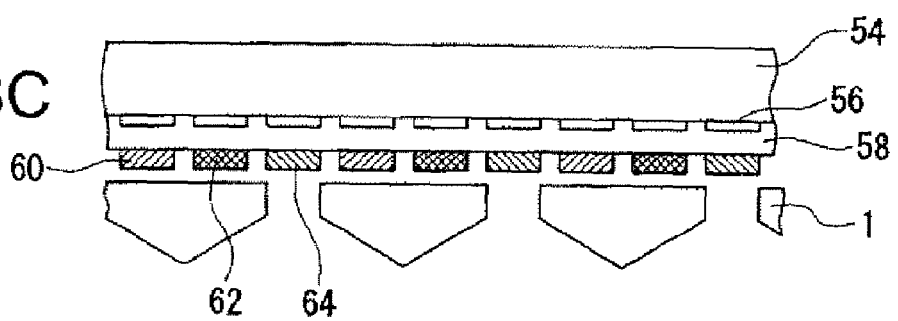

FIGS. 8A to 8C are cross-sectional views illustrating manufacture steps of an organic EL device according to this embodiment.

First, as shown in FIG. 8A, transparent electrodes 56 made of ITO for example are formed on a substrate to be subjected to vapor deposition 54 made of transparent material such as glass. Next, an electron hole transport layer 58 is formed on transparent electrodes 56.

Next, as shown in FIG. 8A, the substrate to be subjected to vapor deposition 54 having the transparent electrodes 56 and electron hole transport layer 58 is conveyed into a vacuum chamber constituting a vapor deposition apparatus and is fixed at an upper part of the interior of the chamber. Then, the masks 1 are aligned to positions at which the light-emitting material (light-emitting layer R) of the substrate to be subjected to vapor deposition 54 is subjected to vapor deposition. Thereafter, the masks 1 are arranged while having a close contact with the substrate to be subjected to vapor deposition 54.

Next, the interior of the vacuum chamber is depressurized and is vacuumized. Then, light-emitting material in a crucible provided at a lower part of the interior of the vacuum chamber is heated and evaporated, thereby forming red light emitting material via the mask 1 on the substrate to be subjected to vapor deposition 54. As a result, the red light emitting layer 60 is formed at a predetermined region of the substrate to be subjected to vapor deposition 54. The light-emitting material is, for example, low molecular organic material using alumiquinolinol complex (Alq3).

Next, as shown in FIG. 8B, the mask 1 is moved from a position at which the red light emitting layer 60 was subjected to vapor deposition to a position at which the light-emitting material (light-emitting layer G) is subjected to vapor deposition. Then, green light emitting material is formed via the mask 1 by the vapor deposition method, thereby forming a green light emitting layer 62.

Similarly, as shown in FIG. 8C, the mask 1 is moved from a position at which the green light emitting layer 62 was subjected to vapor deposition to a position at which light-emitting material (light-emitting layer B) is subjected to vapor deposition. Then, blue light emitting material is formed via the mask 1 by the vapor deposition method, thereby forming a blue light emitting layer 64. By using the mask 1 of this embodiment as described above, light-emitting layers 60, 62, and 64 having predetermined patterns can be formed on the substrate to be subjected to vapor deposition 54 constituting an organic EL device.

Figure 9:
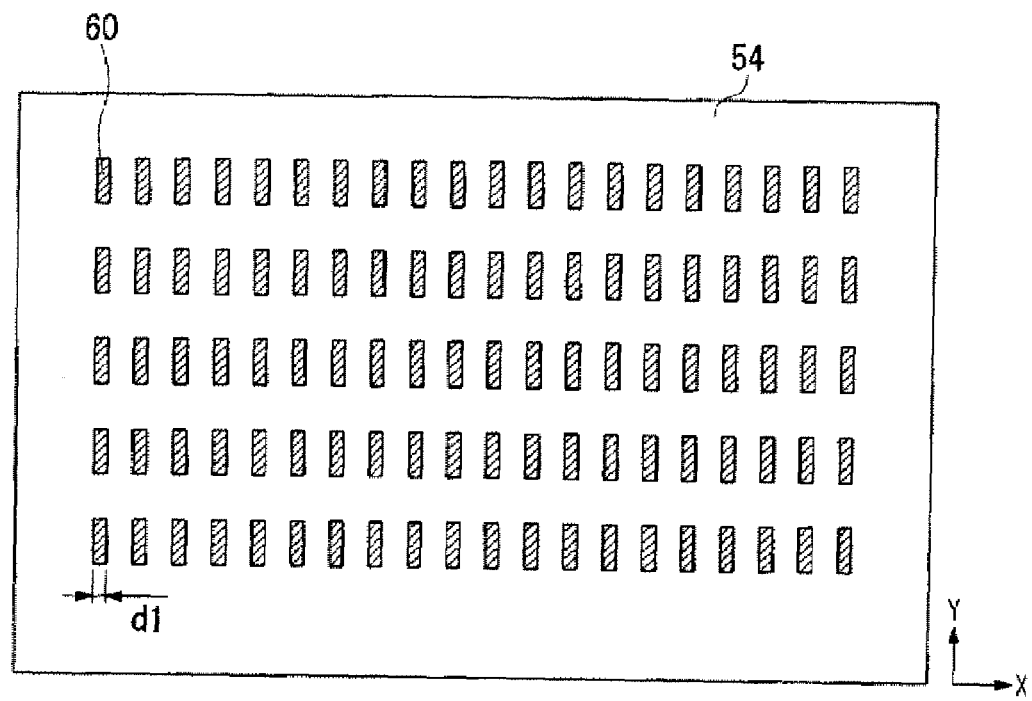
FIG. 9 is a top view illustrating a vapor deposition pattern formed by the mask.
Figure 10:
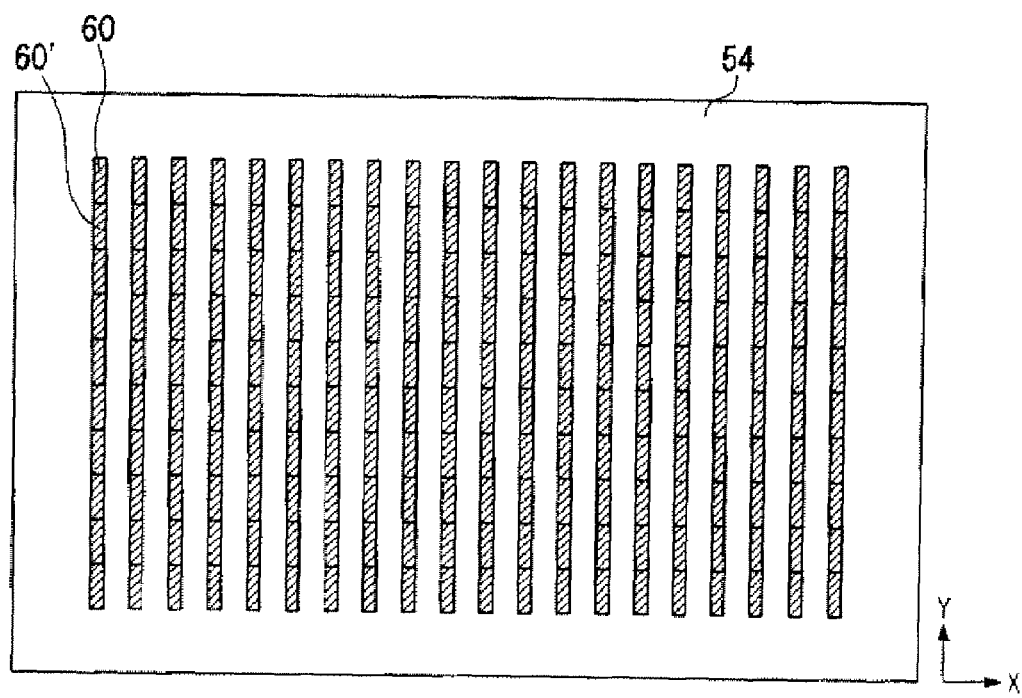
FIG. 10 is a top view illustrating a vapor deposition pattern formed by the mask.
Figure 11:
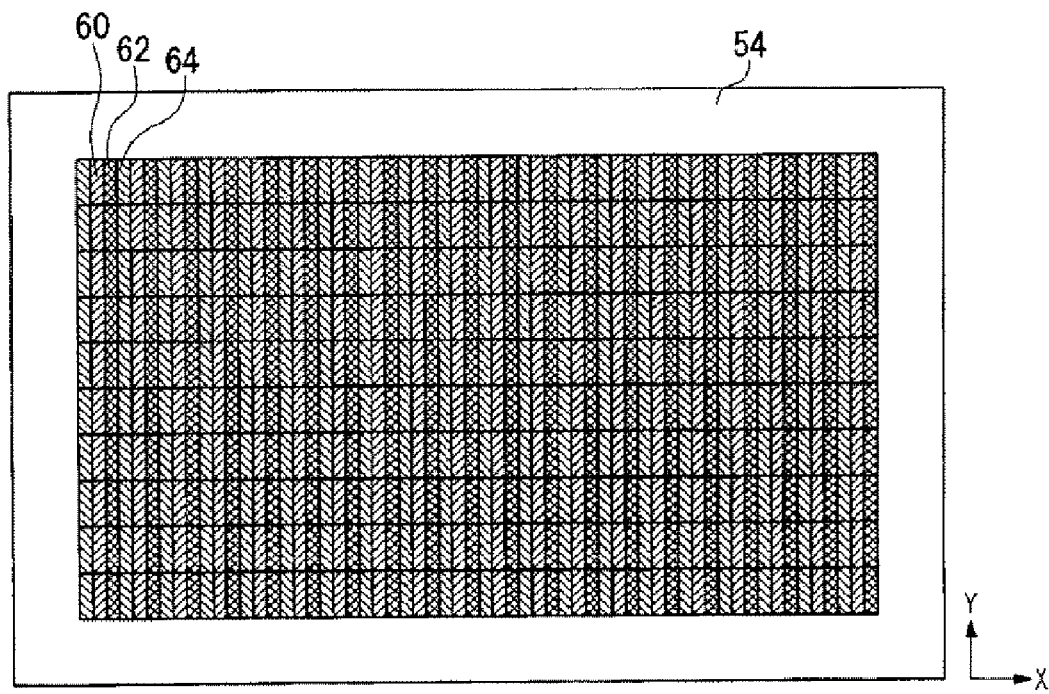
FIG. 11 is a top view illustrating a vapor deposition pattern formed by the mask.

FIG. 9 is a top view illustrating an example of the vapor deposition pattern (thin film pattern) formed using the mask 1 as described above. FIG. 10 is a top view illustrating an example of the substrate including the vapor deposition pattern shown in FIG. 9 again subjected to a vapor deposition processing with the mask 1 moved. FIG. 11 is a top view illustrating an example of the substrate including the vapor deposition pattern shown in FIG. 10 again subjected to a vapor deposition processing with the mask 1 moved.

The substrate 54 as a member on which this vapor deposition pattern is formed may be, for example, a transparent substrate (e.g., glass substrate) as a constituting element of an organic EL device. The vapor deposition pattern in this case is a stripe pattern forming a red light emitting layer 60 in the above-described organic EL device. Thus, the light-emitting layer 60 has a width equal to a subpixel pitch d1 of pixels.

However, the vapor deposition pattern shown in FIG. 9 does not include pixels in a plurality of columns (e.g., 40 columns×5) in red pixels of the organic EL device. Thus, the mask 1 is moved from the substrate 54 in the longitudinal direction (Y axis direction) by 40 pixels for example to perform a vapor deposition processing again. As a result, red light emitting layers 60' as shown in FIG. 10 are patterned. In this manner, a thin film pattern for a large-size screen panel having a large longitudinal stripe pattern can be formed in a simple manner.

The vapor deposition pattern shown in FIG. 10 only includes red light emitting layers 60 and 60' and does not include green or blue light emitting layer. Thus, the mask 1 is moved from the substrate 54 shown in FIG. 10 by a subpixel pitch in the lateral direction (X axis direction) to pattern green light emitting material, thereby forming the green light emitting layer 62 as shown in FIG. 11. Next, the mask 1 is moved by a subpixel pitch in the lateral direction (X axis direction) to pattern blue light emitting material, thereby forming the blue light emitting layer 64 as shown in FIG. 11.

In this manner, a thin film pattern providing color display and constituting a large-size screen panel can be provided in a simple and accurate manner. Although the above embodiment has provided a thin film pattern constituting one large size screen panel by performing a plurality of vapor deposition processings with the same mask 1 moved in a stepwise manner, a thin film pattern constituting one large size screen panel also may be formed by previously forming a plurality of types of masks 1 so that the plurality of types of masks 1 are used alternately. Furthermore, this embodiment forms the block section 26 for covering the gap section 22b (see FIG. 3) having no pattern of mask chips adjacent to each other. In this manner, a cutout section formed in the mask chip 20 can function as the opening section 22a forming one pattern and thus the same pattern as the opening section 22 can be formed in a regular manner.

(Electronic Device)

Next, an example of an electronic device of the present invention will be described.

Figure 12:
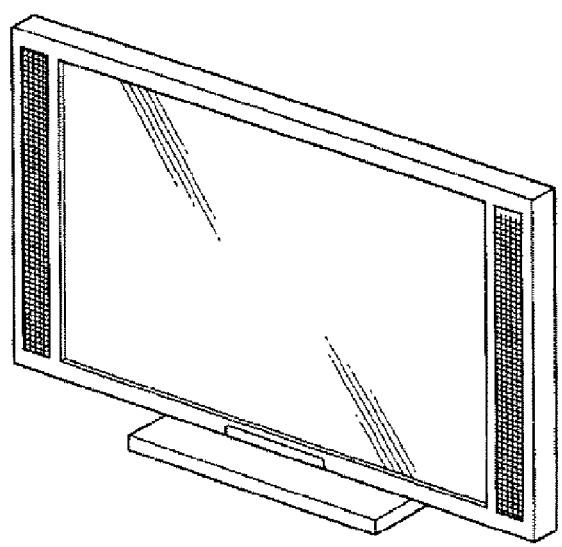
FIG. 12 is a perspective view schematically illustrating a large-size flat screen television.

FIG. 12 is a perspective view illustrating the structure of a large-size flat screen television (electronic device) 1200 including the above-described organic EL device. The large-size flat screen television 1200 shown in FIG. 12 is structured to mainly include: a display section 1201 composed of the organic EL device; a chassis 1202; and an audio output section 1203 (e.g., speaker).

According to this embodiment, the use of the above-described mask can provide the manufacture of a flat screen television having a large-size screen and can provide a high-definition electronic device free from irregular display.

It is noted that the organic EL device of this embodiment can be applied, in addition to the above large-size flat screen television, various electronic devices such as those including: a liquid crystal projector, a multimedia-type personal computer (PC) and an engineering workstation (EWS), pager, a word processor, a view finder-type or monitor direct sight-type video tape recorder, an electronic organizer, an electronic desk calculator, a car navigation apparatus, a POS terminal, or an apparatus including a touch panel.

It is noted that the technical scope of the present invention is not limited to the above-described embodiments and includes various modifications of the above-described embodiments within a range not deviating from the intention of the present invention.

For example, although the above embodiment has provided an integrated structure of the block section 26 of the mask chip 20 with the mask chip 20, the mask chip 20 also may be provided by separating the block section 26 from the mask chip 20. Specifically, a member having a roof-like shape may be adhered via binding material or the like so as to extend from an end section of the mask chip 20 and this member may be used as the block section 26.

Furthermore, in the above embodiment, the block sections 26 are provided in FIG. 1 at both end sections of an opposing face 20a of the mask chip 20A to the mask chip 20B adjacent to the mask chip 20A and the storage sections 28 are provided at both end sections of the other opposing face 20d. Alternatively, another structure also may be used in which the block section 26 is provided at one end section of the mask chip 20A and the storage section 28 is provided at the other end section and the block section 26 is provided at one end section of the mask chip 20A and the storage section 28 is provided at the other end section. This structure also can block the clearance section 22b of the connected section of the mask chips 20.

Furthermore, although the above embodiment has used the mask 1 of this embodiment for the manufacture of an organic EL device, the mask 1 also can be used for other electrooptic apparatuses in which a pattern is formed in a large size substrate.

What is claimed is:

1. A mask in which a plurality of mask chips are connected to one another via a supporting member, comprising:
   a plurality of first opening sections that are provided in the plurality of mask chips and that correspond to a pattern to be formed;
   a cutout section provided at at least one of side faces opposing to each other of the mask chips adjacent to each other;
   a gap section provided at a connected section connecting the mask chips adjacent to each other, the gap section being composed of the cutout section and including a second opening section corresponding to a pattern to be formed; and
   a block section that is provided at at least one of the mask chips adjacent to each other and that covers the gap section other than the second opening section.

2. The mask according to claim 1, wherein the block section is integrated with the mask chip.

3. The mask according to claim 1, wherein the plurality of first opening sections of the mask chip are formed to have a rectangular shape when seen from the top and are formed so that sides in the longer direction of the first opening sections are parallel to each other and sides in the shorter direction of the first opening sections are on a single line;
   an adhesion section to which the supporting member is adhered is provided between the short side of the first opening section of the mask chip and a side of the mask chip opposing to the short side of the first opening section; and
   the block section of the mask chip is orthogonal to the longer direction of the first opening section and is provided to extend in a direction from one end of the adhesion section of the mask chip to the mask chip adjacent thereto.

4. The mask according to claim 1, wherein a storage section is provided between a short side of the first opening section of the mask chip and a one side of the mask chip opposing to the short side of the first opening section and the storage section stores therein the block section provided at the adhesion section of the mask chip adjacent thereto.

5. The mask according to claim 1, wherein the mask chip is made of silicon.

6. A mask chip, comprising:
   a mask chip body including a plurality of opening sections corresponding to a pattern to be formed in a substrate on which film formation is performed;
   a cutout section having a shape corresponding to the opening section provided at at least one of opposing side faces of the mask chip body;
   a block section extending from an end section of one of the side faces of the mask chip body; and
   a storage section for storing the block section provided at an end section of the other of the side faces of the mask chip body.

7. A method for forming a mask by adhering a supporting member to the mask according to claim 1, comprising:
   forming, in the supporting member, a plurality of opening sections through which vapor deposition material is passed;
   placing binding material at a position of the supporting member at which the mask chip is placed;
   placing, at a position at which the binding material of the glass substrate is placed, the adhesion section of the one mask chip;
   placing the adhesion section of another the mask chip at a position at which the binding material of the glass substrate is placed so that the adhesion section of another the mask chip is adjacent to the placed one mask chip; and
   sliding the another mask chip in a direction of the one mask chip to store the block section of the another mask chip in the storage section of the one mask chip.

8. A manufacturing method of a mask chip for forming a predetermined pattern in a substrate on which film formation is performed, comprising:
   forming an insulation film at a surface of a silicon wafer of a plain orientation (110);
   forming a first pattern in the insulation film at one surface of the silicon wafer at a region forming the pattern and a region corresponding to an outer shape of a mask chip body;
   forming a second pattern in the insulation film at the other surface of the silicon wafer opposed to a region including the first pattern provided at one surface of the silicon wafer;
   forming a mask pattern on the first pattern at one surface of the silicon wafer so that the silicon wafer in a region corresponding to an outer shape of the mask chip body is exposed;
   etching one surface of the silicon wafer by using the mask pattern as a mask to form, in the silicon wafer, a groove pattern penetrating or not penetrating the other surface;
   removing the mask pattern to subsequently dice the silicon wafer to have an outer shape of the mask chip body; and
   subjecting one surface and the other surface of the silicon wafer to a crystal anisotropy etching by using the first pattern of the insulation film at one surface of the silicon wafer and the second pattern of the insulation film at the other surface of the silicon wafer as a mask so that the mask chip body includes a plurality of opening sections and a block section extending from the mask chip body.

9. An electronic device, comprising an electrooptic apparatus manufactured by the mask according to claim 1.

* * * * *